United States Patent
Sawada (10) Patent No.: US 7,271,600 B2
(45) Date of Patent: Sep. 18, 2007

(54) SEMICONDUCTOR SWITCH CIRCUIT

(75) Inventor: Toshiaki Sawada, Tokyo (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 10/572,185

(22) PCT Filed: Sep. 15, 2004

(86) PCT No.: PCT/JP2004/013460

§ 371 (c)(1),
(2), (4) Date: Mar. 16, 2006

(87) PCT Pub. No.: WO2005/029702

PCT Pub. Date: Mar. 31, 2005

(65) Prior Publication Data

US 2007/0120573 A1     May 31, 2007

(30) Foreign Application Priority Data

Sep. 18, 2003   (JP) ............................. 2003-326549

(51) Int. Cl.
*G01R 27/08* (2006.01)
*G01R 31/26* (2006.01)

(52) U.S. Cl. ...................... 324/713; 324/765; 324/761

(58) Field of Classification Search ................. 324/713
See application file for complete search history.

(56) References Cited

U.S. PATENT DOCUMENTS

2004/0183508 A1* 9/2004 Toyoda et al. ............... 323/265

FOREIGN PATENT DOCUMENTS

JP        03-029512       2/1991

OTHER PUBLICATIONS

Office Action issued on Mar. 16, 2007 for Korean Patent Application No. 10 2006-7004590 with its full English translation.
Office Action issued on Apr. 10, 2007 for Japanese Patent Application No. 2005 514044 with its full English translation.

* cited by examiner

*Primary Examiner*—Vincent Q. Nguyen
(74) *Attorney, Agent, or Firm*—David N. Lathrop, Esq.; Gallagher & Lathrop (57) ABSTRACT

First, second, and third semiconductor switches are connected in series between input and output terminals and first and second voltage application circuits are connected in parallel to first and third semiconductor switches, whereby providing a semiconductor switch circuit. Each voltage application circuit comprises a first or second voltage application semiconductor switch connected at the output side thereof with a first or second direct current amplifier having a gain state of approximately +1 and whose input side is connected to the input or output terminal. One end of the first or second voltage application semiconductor switch is connected to a first junction of the first and second semiconductor switches, or to a junction of the second and third semiconductor switches, respectively. When first through third semiconductor switches are turned OFF, first and second voltage application semiconductor switches are turned ON to apply the potentials of input and output terminals to the first and second junctions, respectively.

13 Claims, 7 Drawing Sheets

PRIOR ART

SEMICONDUCTOR SWITCH CIRCUIT

TECHNICAL FIELD

The present invention relates to a semiconductor switch circuit suitable for use in a semiconductor device testing apparatus or the like, for example, and particularly relates to a semiconductor switch circuit having no leakage of current to the outside.

BACKGROUND ART

A method for performing direct current testing is employed in a semiconductor device testing apparatus wherein a large number of voltage/current generators having different voltage values are prepared for testing the direct current characteristics of the terminals (hereinafter referred to as pins) of a semiconductor device, the outputs of these numerous voltage/current generators are selectively applied to the pins of the device under test via a matrix circuit, and an arbitrary voltage is applied to each pin.

Figure 7:
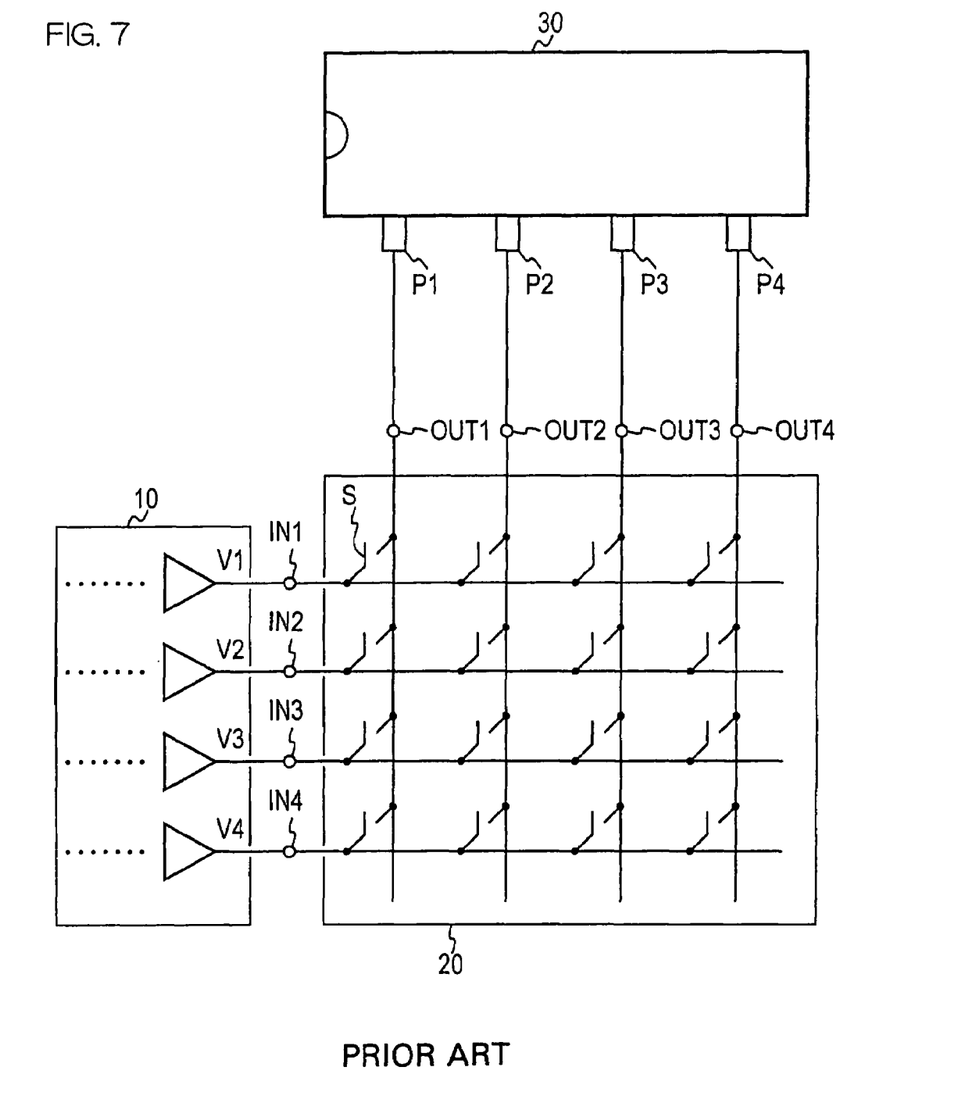
FIG. 7 is a connection diagram of a semiconductor device testing apparatus provided with a conventional matrix circuit.

FIG. 7 shows the structure of a semiconductor device testing apparatus that uses a widely known matrix circuit. The voltage/current generator group 10 outputs various voltages V1, V2, V3, and V4; and applies these voltages V1 through V4 to the input terminals IN1 through IN4 of the matrix circuit 20. Switches S are arranged in a matrix in the matrix circuit 20, and any one of the switches S is selectively controlled to an ON state and selectively outputs one of the voltages V1 through V4 to one of the output terminals OUT1 through OUT4.

The pins P1 through P4 of the semiconductor device under test 30 are connected to the output terminals OUT1 through OUT4 of the matrix circuit 20, an arbitrary voltage among the voltages V1 through V4 is applied to each pin P1 through P4, and the direct current characteristics of the pins are measured.

In other words, a configuration is adopted whereby the presence of the matrix circuit 20 enables any voltage among the voltages V1 through V4 to be applied to any of the pins P1 through P4. A voltage source current measurement test is performed by measuring the current when each of voltages V1 through V4 is applied as to whether or not the current is within a pre-set range of values. A current source voltage measurement test is also performed, when a prescribed current is applied to the pins P1 through P4, as to whether or not a prescribed voltage is generated in the pins P1 through P4.

In the matrix circuit 20 shown in FIG. 7, when the switches S are ON state, lines connected by the switch are maintained at the same electrical potential, but when the switches are OFF state, a potential difference corresponding to the voltages V1 through V4 is presented across the switches S. Consequently, when a semiconductor switch formed from, for example, a FET (field-effect transistor), a photo-MOS relay composed of a light-emitting element and a light-receiving element, or the like is used for the switches S constituting the matrix circuit 20, a leak current occurs in the semiconductor switch at the intersecting portion in which the potential difference is presented, with the drawback of measurement error being caused by the leak current.

Figure 8A:
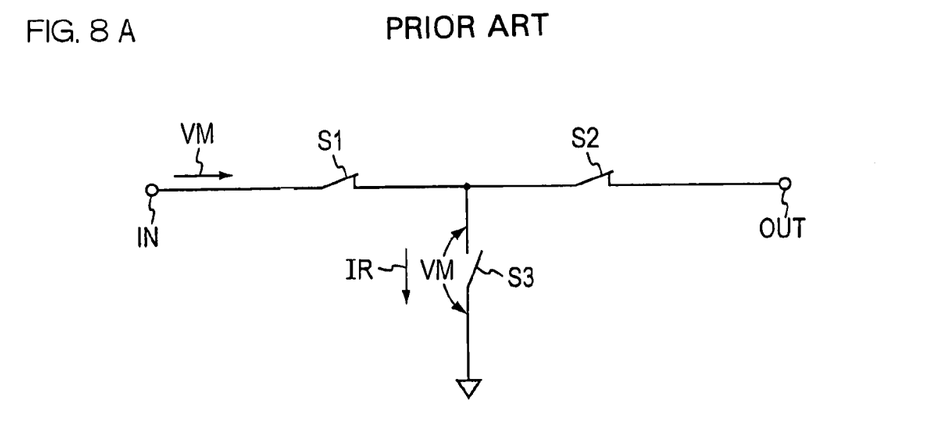
FIG. 8A is a diagram of the operation of a conventional semiconductor switch circuit in the ON state.
Figure 8B:
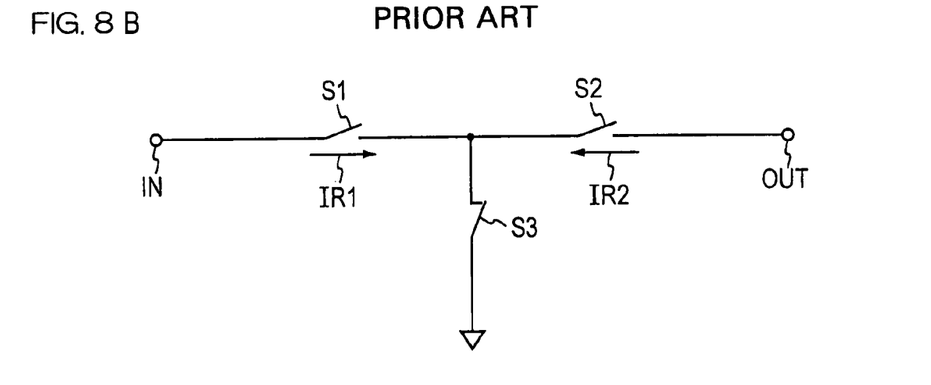
FIG. 8B is a diagram of the operation of same in the OFF state.

FIG. 8 shows the structure of a conventional semiconductor switch circuit. FIG. 8A shows a conducting state between the input terminal IN and the output terminal OUT; and FIG. 8B shows a non-conducting state between the input terminal IN and the output terminal OUT. Each of the semiconductor switches S1, S2, and S3 uses a FET, a photo-MOS relay composed of a light-emitting element and a light-receiving element, or other semiconductor switch. In the state shown in FIG. 8A in which the switches S1 and S2 are ON, and the switch S3 is OFF, the voltage VM applied to the input terminal IN is applied across the OFF semiconductor switch S3, and the leak current IR is caused to flow through the semiconductor switch S3 by application of this voltage VM.

In the state shown in FIG. 8B, in which the switches S1 and S2 are OFF, and the switch S3 is ON, a non-conducting state exists between the input terminal IN and the output terminal OUT, and the voltage applied to the input terminal IN is not fed to the output terminal. Since in this case the voltage VM applied to the input terminal IN is divided into two parts as to the semiconductor switches S1 and S2, so that leak currents IR1 and IR2 are caused to flow through the semiconductor switches S1 and S2 by these divided voltages.

The leak current IR shown in FIG. 8A and the leak currents IR1 and IR2 shown in FIG. 8B all flow through the semiconductor switch S3 or S1 and S2 by flowing out to the outside or flowing in from the outside through the input terminal IN or the output terminal OUT. Therefore, when the conventional semiconductor switch circuit shown in FIG. 8 is applied to the matrix circuit 20 shown in FIG. 7, the drawback of measurement error is caused by the leak currents flowing through the semiconductor switch circuit.

In particular, FIG. 7 shows a matrix circuit structure having four input terminals and four pins of output terminals, but a matrix circuit equipped with four or more input terminals connected to the voltage/current generator group, and a number of output terminals equal to the number of pins of the semiconductor device under test 30, is required in an actual semiconductor device testing apparatus; and the matrix circuit is large in scale. In other words, numerous switches S are used in an actual matrix circuit, and when a leak current occurs in each of such a large number of switches in an OFF state, the total quantity of leak current becomes large, and major errors result.

In the past, mechanical contact relays had to be used in order to avoid the effects of leak currents. A mercury relay has also been used due to the service life of the relay contacts in actual practice. However, since the use of mercury relays will be limited due to environmental issues, and since there is limitation on the attachment orientation of a mercury relay, the mercury relay is difficult to implement in a test head in which the matrix circuit 20 is placed near the semiconductor device under test 30, and must be mounted on the side of the testing apparatus body. Therefore, a long cable must be used to form a connection between the matrix circuit 20 and the test head.

DISCLOSURE OF THE INVENTION

Problems to be Solved by the Invention

In resolving the above-described problems of the prior art, it is an object of the present invention to provide a semiconductor switch circuit that does not use a mercury relay; that uses a semiconductor switch in which a leak current is unavoidable, yet the effect of the leak current can be minimized; and with which a matrix circuit whose mounting position is not limited can be formed.

Means for Solving the Problems

A first aspect of the present invention provides a semiconductor switch circuit configured so that a first semiconductor switch, a second semiconductor switch, and a third semiconductor switch connected in series are inserted between an input terminal and an output terminal; first and second voltage application means are connected in parallel to the first semiconductor switch, one end of which is connected to the input terminal and the other end is connected to one end of the second semiconductor switch, and to the third semiconductor switch, one end of which is connected to the other end of the second semiconductor switch and the other end is connected to the output terminal; and switch control means operates and controls the first, second, and third semiconductor switches in the ON and OFF states, and simultaneously operates and controls the first and second voltage application means in the OFF and ON states in a reverse mode. When the first, second, and third semiconductor switches are operated and controlled in the OFF state by the switch control means, the first voltage application means applies the potential of the input terminal to the junction between the first semiconductor switch and second semiconductor switch, and the second voltage application means applies the potential of the output terminal to the junction between the second semiconductor switch and third semiconductor switch.

A second aspect of the present invention provides a semiconductor switch circuit configured so that at least two semiconductor switches connected to each other in series are inserted between an input terminal and an output terminal; voltage application means is connected in parallel to either one of the two semiconductor switches; and switch control means operates and controls these semiconductor switches in the ON state and OFF state, and simultaneously controls the voltage application means in the OFF state and ON state in a reverse mode. When the two semiconductor switches are operated and controlled in the OFF state by the switch control means, the voltage application means applies the potential of the input terminal or the potential of the output terminal to the junction of the two semiconductor switches.

According to a third aspect of the present invention, the voltage application means in the semiconductor switch circuit obtained in the first or second aspect comprises a direct current amplifier set to a gain state of approximately +1, and a voltage application semiconductor switch connected between the output terminal of the direct current amplifier and the voltage application point, for operating in a reverse mode with the semiconductor switches.

According to a fourth aspect of the present invention, the voltage application means in the semiconductor switch circuit obtained in the first or second aspect comprises a direct current amplifier set to a gain state of approximately +1; and a resistor connected between the output terminal of the direct current amplifier and the voltage application point.

According to a fifth aspect of the present invention, a semiconductor switch, that is connected in parallel to the voltage application means in the semiconductor switch circuit obtained in the first or second aspect, is composed of anti-parallel connected diode elements.

According to a sixth aspect of the present invention, the semiconductor switch circuit according to any one of the first through fifth aspects is used as intersection switches, and forms a matrix circuit.

According to a seventh aspect of the present invention, a semiconductor device testing apparatus is formed using the matrix circuit according to the sixth aspect.

Effect of the Invention

According to the present invention, voltage application means is connected in parallel to a semiconductor switch, and the potential of the input terminal and the potential of the output terminal are applied by this potential application means to the junctions of series-connected semiconductor switches. No potential difference is presented to both ends of the semiconductor switch in an OFF state by the voltage application operation of the voltage application means. As a result, since the potential difference is not presented to the OFF-state semiconductor switch, which would normally have received a potential difference, so that the occurrence of leak currents is minimized. A semiconductor switch circuit can therefore be provided with little occurrence of leak currents even though it accompanies the use of the semiconductor switches.

As a result, since the switches can all be composed of semiconductor switches when the semiconductor switch circuit according to the present invention is used in the conventional matrix circuit 20 of the semiconductor device testing apparatus shown in FIG. 7, the limitations imposed by the mercury relay, which had to be used in the past, are eliminated; and an improved matrix circuit is obtained whereby the adverse effects of leak currents can be prevented from occurring.

When this improved matrix circuit is used as substitution for the matrix circuit of the semiconductor device testing apparatus shown in FIG. 7, this improved matrix circuit can be directly mounted on a test head provided for connecting the semiconductor device under test 30 to the testing apparatus, the cable between the semiconductor device under test and the matrix circuit 20 can be shortened, and an improved semiconductor device testing apparatus is obtained in which there is no incidence of leak currents flowing out of the matrix circuit, nor of any measurement error.

BRIEF DESCRIPTION OF THE DRAWINGS

FIG. 1A is a connection diagram of Embodiment 1 in the ON state, and FIG. 1B is a connection diagram of same in the OFF state;

BEST MODE FOR CARRYING OUT THE INVENTION

Embodiments of the present invention will be described hereinafter with reference to the drawings.

Embodiment 1

Figure 1:
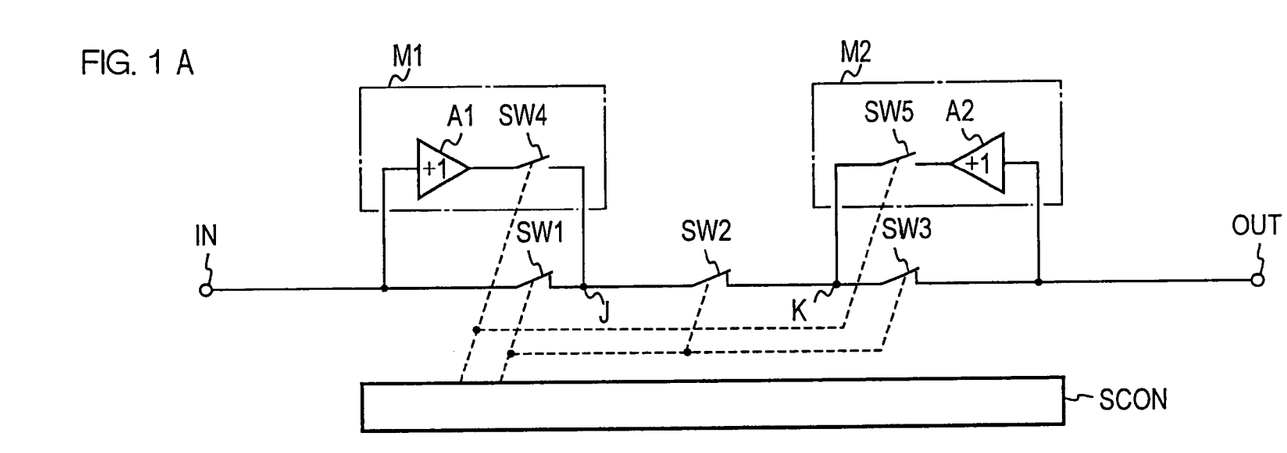
FIG. 1 shows Embodiment 1 of the semiconductor switch circuit according to the present invention.

Embodiment 1 of the present invention is shown in FIG. 1. The switch circuit shown in FIG. 1 corresponds to the single switch S described in FIG. 7. FIG. 1A shows the ON state of the switch S, and FIG. 1B shows the OFF state of the switch S.

A first semiconductor switch SW1, a second semiconductor switch SW2, and a third semiconductor switch SW3 (hereinafter referred to simply as first switch, second switch, and third switch) are connected in series between an input terminal IN and an output terminal OUT. The first switch SW1, second switch SW2, and third switch SW3 are each composed of a FET, a photo-MOS relay composed of a light-emitting element and a light-receiving element, or another type of semiconductor switch. One end of the first switch SW1 is connected to the input terminal IN, and the other end thereof is connected to one end of the second switch SW2. The other end of the second switch SW2 is connected to one end of the third switch SW3, and the other end of the third switch SW3 is connected to the output terminal OUT.

First voltage application means M1 for applying the potential of the input terminal IN to the junction J between the first switch SW1 and the second switch SW2 is connected in parallel to the first switch SW1. Second voltage application means M2 for applying the potential of the output terminal OUT to the junction K between the second switch SW2 and the third switch SW3 is connected in parallel to the third switch SW3.

The voltage application means M1 and M2 may be composed of direct current amplifiers A1 and A2 having input terminals connected to the input terminal IN or output terminal OUT, a gain set to approximately +1, and a high input impedance; and voltage application semiconductor switches SW4 and SW5 connected between the output terminals of the direct current amplifiers A1 and A2 and the junction J or K.

These voltage application semiconductor switches SW4 and SW5 may also be composed of a FET or other type of semiconductor switch element. These voltage application semiconductor switches SW4 and SW5 are referred to hereinafter as switches SW4 and SW5. A direct current amplifier having a gain set to +1 can be implemented by a structure, e.g., in which the output terminal of an operational amplifier having an inverting input terminal and a non-inverting input terminal is directly connected to the inverting input terminal. In this case, an amplifier having as high an input impedance as possible is used as the operational amplifier.

The reference symbol SCON indicates the switch control means. This switch control means SCON operates and controls the ON and OFF states of the first switch SW1, the second switch SW2, and the third switch SW3, concurrently; and simultaneously operates and controls the OFF and ON states of the switches SW4 and SW5 concurrently constituting the voltage application means M1 and M2. The ON and OFF operations of the switches SW4 and SW5 are performed in a reverse mode from the ON and OFF operations of the first switch SW1, second switch SW2, and third switch SW3.

Therefore, when the first switch SW1, the second switch SW2, and the third switch SW3 are operated and all controlled to the ON state by the switch control means SCON, and the switches SW4 and SW5 are simultaneously operated and controlled to the OFF state (FIG. 1A), a short-circuit occurs in the series-connected circuit of the first switch SW1, second switch SW2, and third switch SW3 between the input terminal IN and output terminal OUT, and the voltage applied to the input terminal IN is outputted unchanged to the output terminal OUT. The semiconductor switches SW4 and SW5 are in the OFF state at this time, but since both ends of the voltage application means M1 and M2 in this state are short-circuited by the first switch SW1 and third switch SW3, and maintained at the same potential, a leak current does not flow through the switches SW4 and SW5.

When the first switch SW1, the second switch SW2, and the third switch SW3 are controlled to the OFF state, and the switches SW4 and SW5 are simultaneously controlled to the ON state (FIG. 1B), the first voltage application means M1 applies the potential of the input terminal IN to the junction J, and the second voltage application means M2 applies the potential of the output terminal OUT to the junction K.

As a result, both ends of the first switch SW1 and of the third switch SW3 are maintained at the same potential, and a leak current does not flow through the first switch SW1 or third switch SW3. However, the potential difference between the input terminal IN and the output terminal OUT is presented to both ends of the second switch SW2 in this arrangement, and a leak current flows through the second switch SW2 in accordance with this potential difference.

Figure 2A:
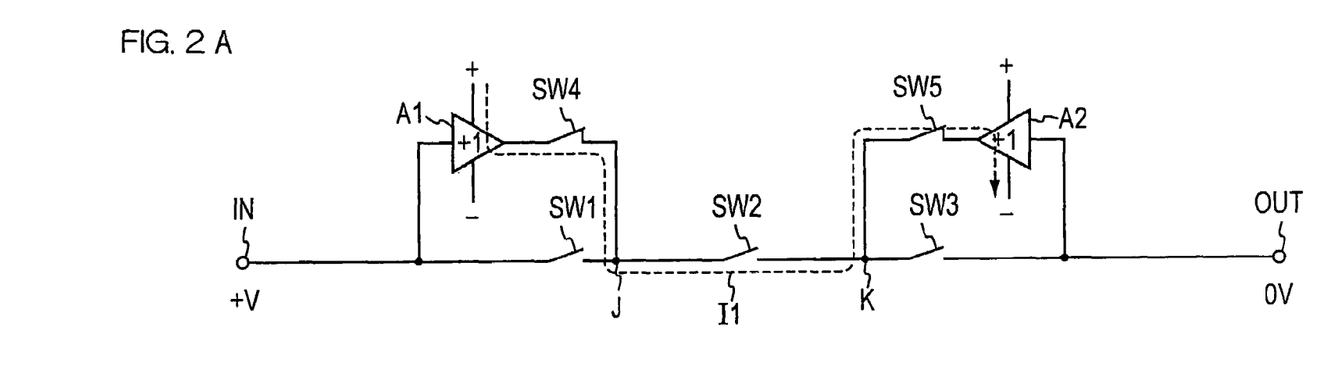
FIGS. 2A and 2B are diagrams showing the operation of Embodiment 1 shown in FIG. 1 in the OFF state.

FIG. 2A shows the current path of the leak current I1 when the input terminal IN is a positive potential +V and the output terminal OUT is 0 V. The direct current amplifier A1 in this case outputs a current that corresponds to the leak current I1, and the direct current amplifier A2 executes an operation for absorbing that current I1.

Figure 2B:
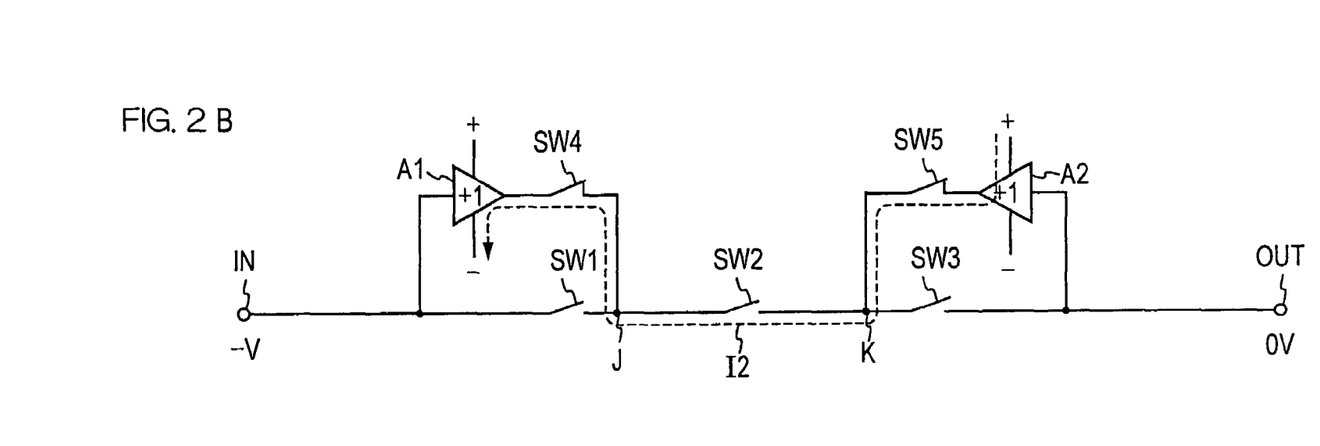

FIG. 2B shows the current path of the leak current I2 when the input terminal IN is a negative potential −V and the output terminal OUT is 0 V. The direct current amplifier A2 in this case outputs a current that corresponds to the leak current I2, and the direct current amplifier A1 executes an operation for absorbing that current. When the potential of the input terminal IN changes to a positive potential and also to a negative potential in this manner, the direct current amplifiers A1 and A2 must be operated by two positive and negative power sources. However, there is no need for the two power sources when the range of the voltage applied to the input terminal IN is limited to only positive potentials or only negative potentials, and it is sufficient to have an amplifier that operates only on positive voltages, or an amplifier that operates only on negative voltages.

According to this Embodiment 1 thus configured, when the first switch SW1 through third switch SW3 are controlled to the OFF state with a potential difference presented between the input terminal IN and the output terminal OUT, and even when the leak currents I1 and I2 flow through the second switch SW2, these leak currents I1 and I2 are transferred between the direct current amplifiers A1 and A2 constituting the voltage application means M1 and M2 as shown in FIGS. 2A and 2B, and neither flow out to the outside nor flow in from the outside through the input terminal IN and output terminal OUT. In other words, error is not introduced into the measurement system. The leak currents flowing through the input terminals of the direct current amplifiers A1 and A2 constituting the voltage application means M1 and M2 flow through the input terminal IN and the output terminal OUT, but these leak currents can be made extremely small by using amplifiers having high input impedance for the direct current amplifiers A1 and A2, and the introduction of substantial error is prevented.

Embodiment 2

Figure 3A:
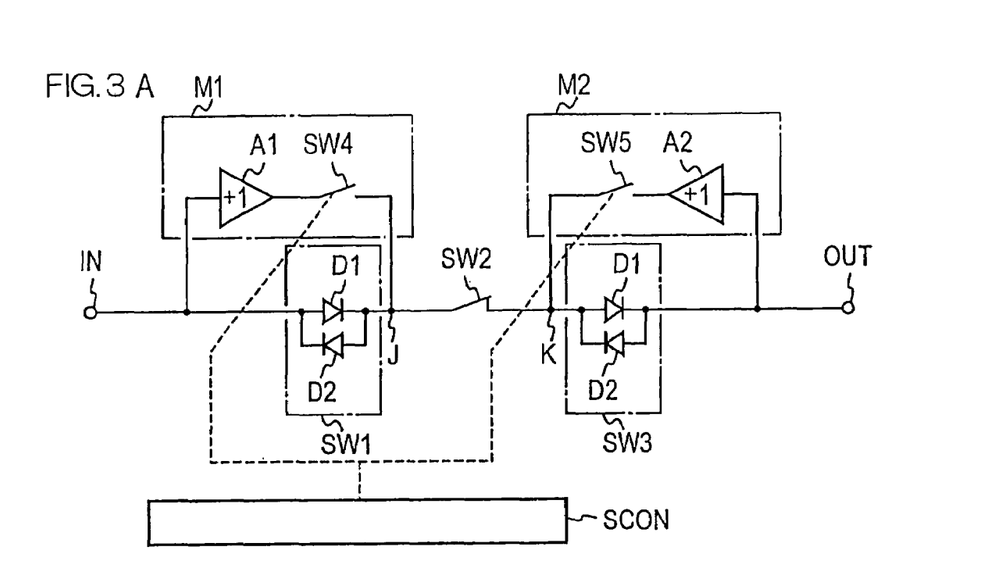
FIG. 3A is a connection diagram of Embodiment 2 of the present invention in the ON state.

FIG. 3 shows Embodiment 2 of the present invention. A case is described in this embodiment in which the first switch SW1 and third switch SW3 are composed of diodes D1 and D2 connected in anti-parallel connection circuit.

When the second switch SW2 is controlled to the ON state and the switches SW4 and SW5 are simultaneously controlled to the OFF state (FIG. 3A) by the switch control means SCON, the voltage applied between the input terminal IN and the output terminal OUT is presented across the series-connected circuit of the first switch SW1, second switch SW2, and third switch SW3. The diodes D1 constituting the first switch SW1 and third switch SW3 become conducting state when the polarity of this voltage is a positive potential on the input terminal IN side, and the voltage presented to the input terminal IN is outputted to the output terminal OUT through these conducting diodes. When the input terminal IN side is a negative potential, the diodes D2 become conducting state, and the negative potential is transmitted to the output terminal OUT through these conducting diodes D2. The switches SW4 and SW5 are in the OFF state at this time, but both ends of the voltage application means M1 and M2 are short-circuited by the diodes of the first switch SW1 and third switch SW3 in this state, and are maintained at the same potential. Therefore, a leak current does not flow through the switches SW4 and SW5.

When the second switch SW2 is controlled to the OFF state and the switches SW4 and SW5 are simultaneously controlled to the ON state (FIG. 3B) by the switch control means SCON, since the potentials between the ends of each of both the anti-parallel connection circuits of the diodes D1 and D2 constituting the first switch SW1 and third switch SW3 are made the same by the voltage application means, the first switch SW1 and third switch SW3 are set to the OFF state, and a leak current does not flow therethrough. The input terminal IN is then separated from the output terminal OUT by the second switch SW2, and the voltage applied to the input terminal IN is not outputted to the output terminal OUT.

Figure 3B:
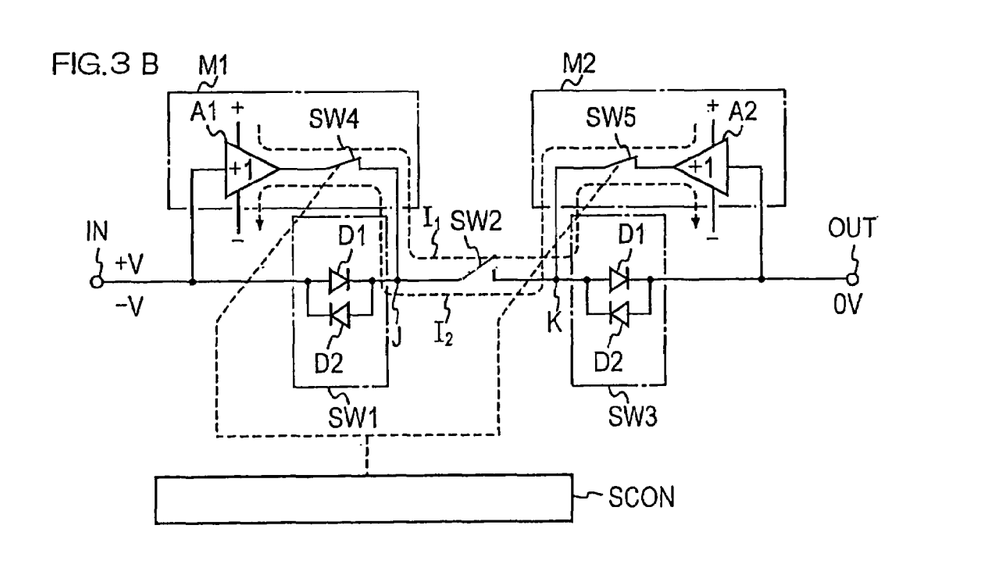
FIG. 3B is a connection diagram of same in the OFF state.

In the case of this Embodiment 2, when the first switch SW1 through third switch SW3 are in the OFF state (FIG. 3B), the voltages (+V and 0) or (−V and 0) applied between the input terminal IN and the output terminal OUT are applied between the ends of the second switch SW2 in the same manner as in FIG. 1B and a leak current (I1 or I2) flows through the second switch SW2 due to this voltage. However, this leak current is transferred between the direct current amplifiers A1 and A2 constituting the voltage application means M1 and M2 as described above, but does not flow out to the outside (note that the current paths are depicted in FIG. 3B based on FIGS. 2A and 2B).

Embodiment 3

FIG. 4 shows Embodiment 3 of the present invention. A case is described in this embodiment in which the switches SW4 and SW5 constituting the voltage application means M1 and M2 are substituted with resistors R.

Figure 4A:
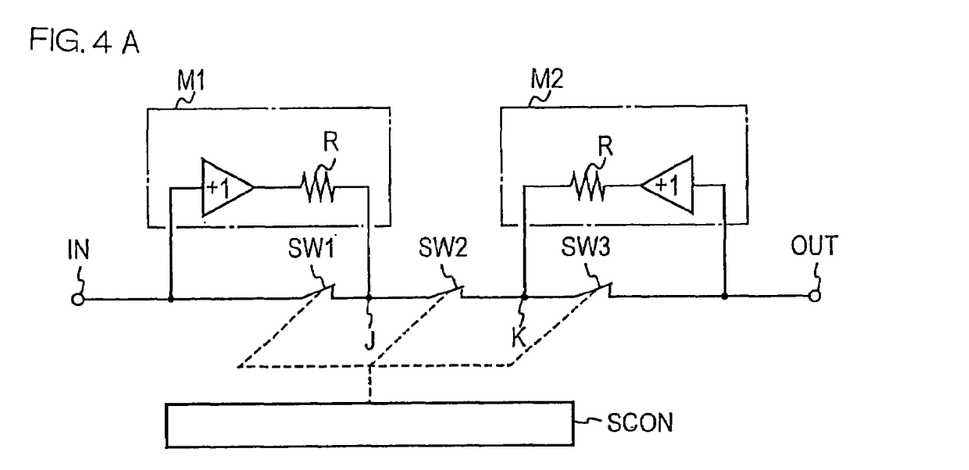
FIG. 4A is a connection diagram of Embodiment 3 of the present invention in the ON state.

The voltage applied to the input terminal IN is also outputted to the output terminal OUT in this example in the same manner as in the aforementioned embodiments when the first switch SW1 through third switch SW3 are all controlled to the ON state by the switch control means SCON (FIG. 4A). Both ends of the voltage application means M1 and M2 are also short-circuited by the first switch SW1 and third switch SW3 and maintained at the same potential. Therefore, a leak current does not flow through the switches SW4 or SW5.

When the first switch SW1 through third switch SW3 are controlled to the OFF state by the switch control means SCON (FIG. 4B), the voltage application means M1 and M2 apply the potential of the input terminal IN and the potential of the output terminal OUT to the junctions J and K, respectively, and both ends of the first switch SW1 and third switch SW3 are maintained at the same potential. Consequently, a leak current does not flow through the first switch SW1 or third switch SW3. The input terminal IN is separated from the output terminal OUT by the second switch SW2, and the voltage applied to the input terminal IN is not outputted to the output terminal OUT.

Figure 4B:
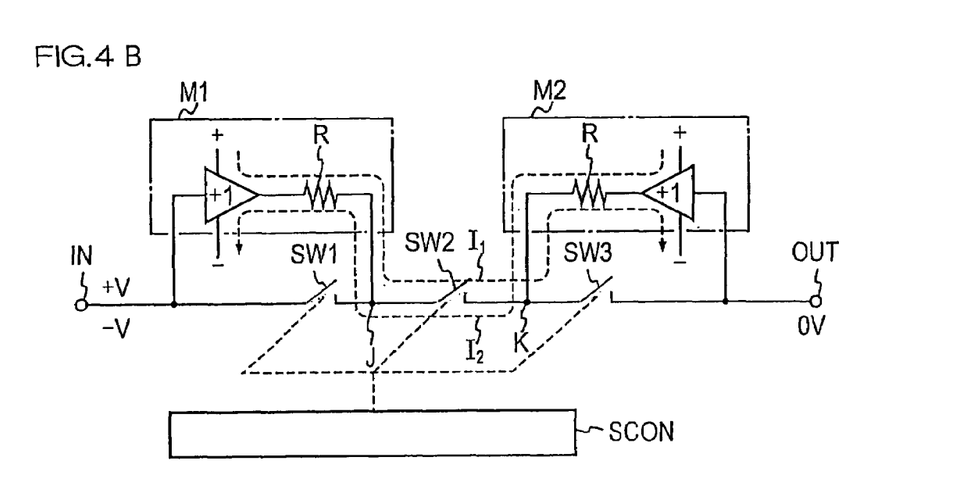
FIG. 4B is a connection diagram of same in the OFF state.

The effect of substituting the switches SW4 and SW5 with the resistors R is that when the first switch SW1 through third switch SW3 are controlled to the OFF state (FIG. 4B), the voltages (+V and 0) or (−V and 0) applied between the input terminal IN and the output terminal OUT are applied to both ends of the second switch SW2, and a leak current (I1 or I2) corresponding to this voltage flows through the second switch SW2. However, this leak current is transferred between the direct current amplifiers A1 and A2 constituting the voltage application means M1 and M2 as described above, but does not flow out to the outside (note that the current paths are depicted in FIG. 4B based on FIGS. 2A and 2B).

The only problem is that this leak current flows through the resistor R, and a voltage decrease occurs in the resistor R. An effect may be caused by this voltage decrease.

However, since this voltage decrease is only slight due to the extremely small value of the leak current flowing through the second switch SW2, even when this slight voltage is applied to both ends of the first switch SW1 and third switch SW3, the value of the leak current flowing through the first switch SW1 and third switch SW3 becomes even smaller, and the effect thereof on the input terminal IN and output terminal OUT is extremely small.

Embodiment 4

Figure 5:
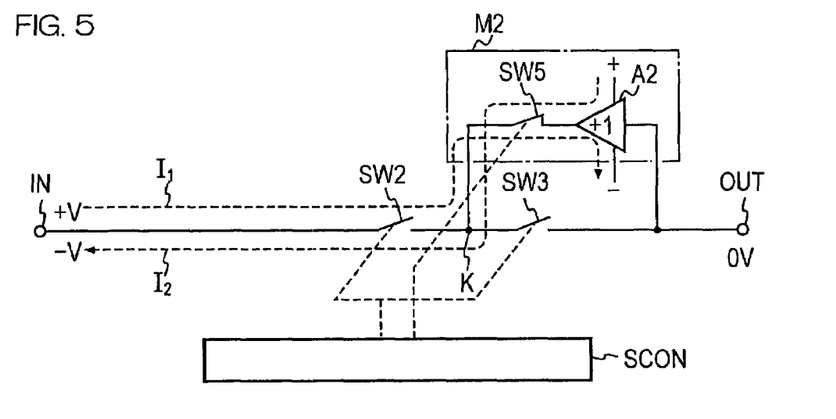
FIG. 5 is a connection diagram of Embodiment 4 of the present invention in the OFF state.

FIG. 5 shows Embodiment 4 of the present invention. This embodiment is an example of the semiconductor switch circuit proposed in claim 2, and describes a case in which a leak current can be allowed to flow through the input terminal IN side. In other words, in this case the first switch SW1 and the first voltage application means M1 connected in parallel thereto in the configuration shown in FIG. 1A have been omitted, the second switch SW2 and the third switch SW3 are connected in series, this series-connected circuit is inserted between the input terminal IN and the output terminal OUT, and the second voltage application means M2 is connected in parallel only to the third switch SW3.

Due to occur a conducting state between the input terminal IN and the output terminal OUT, the input terminal IN and output terminal OUT are maintained at the same potential in this example when the second switch SW2 and third switch SW3 are controlled to the ON state, and the switch SW5 is controlled to the OFF state by the switch control means SCON. Since both ends of the second voltage application means M2 are short-circuited by the third switch SW3 at this time, a leak current does not flow through the switch SW5.

When the second switch SW2 and the third switch SW3 are controlled to the OFF state, and the switch SW5 is controlled to the ON state by the switch control means SCON (FIG. 5), a non-conducting state exists between the input terminal IN and the output terminal OUT, and the potential of the output terminal OUT is applied to the junction K by the operation of the second voltage application means M2. Consequently, the voltages (+V and 0) or (−V and 0) applied between the input terminal IN and the output terminal OUT are applied to both ends of the second switch SW2 at this time, and a leak current (I1 or I2) flows through the second switch SW2 due to this voltage; however, this leak current flows out through the direct current amplifier A2 constituting the second voltage application means M2, or flows in through the direct current amplifier A2. This leak current therefore flows through the input terminal IN side, but does not flow through the output terminal OUT side (note that the current paths are depicted in FIG. 5 based on FIGS. 2A and 2B).

Embodiment 5

Figure 6:
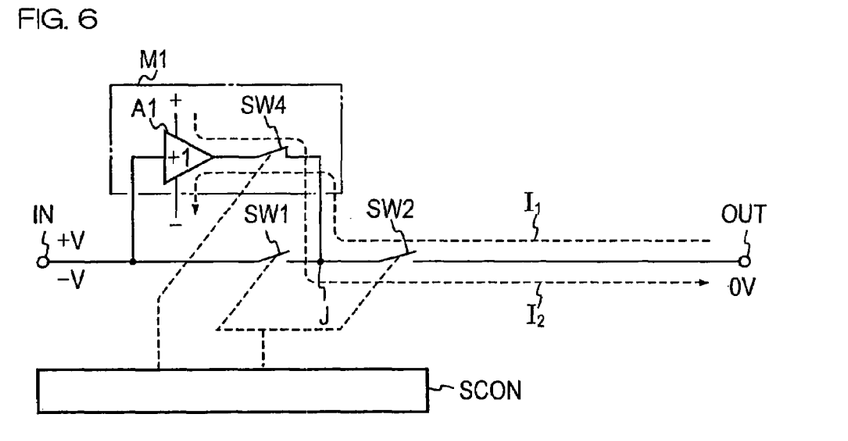
FIG. 6 is a connection diagram of Embodiment 5 of the present invention in the OFF state.

FIG. 6 shows Embodiment 5 of the present invention. This embodiment is another example of the semiconductor switch circuit proposed in claim 2, and describes a case in which a leak current may flow through the output terminal OUT side. In this case, therefore, the third switch SW3 and the second voltage application means M2 connected in parallel thereto in the configuration shown in FIG. 1A have been omitted, the first switch SW1 and the second switch SW2 are connected in series, this series-connected circuit is inserted between the input terminal IN and the output terminal OUT, and the first voltage application means M1 is connected in parallel only to the first switch SW1.

Due to occur a conducting state between the input terminal IN and the output terminal OUT, the input terminal IN and output terminal OUT are maintained at the same potential in this example when the first switch SW1 and second switch SW2 are controlled to the ON state, and the switch SW4 is controlled to the OFF state by the switch control means SCON. Since both ends of the first voltage application means M1 are short-circuited by the first switch SW1 at this time, a leak current does not flow through the switch SW4.

When the first switch SW1 and the second switch SW2 are controlled to the OFF state, and the switch SW4 is controlled to the ON state by the switch control means SCON (FIG. 6), a non-conducting state exists between the input terminal IN and the output terminal OUT, and the potential of the input terminal IN is applied to the junction J by the operation of the first voltage application means M1. Consequently, the voltages (+V and 0) or (−V and 0) applied between the input terminal IN and the output terminal OUT are applied to both ends of the second switch SW2 at this time, and a leak current (I1 or I2) flows through the second switch SW2 due to this voltage, but this leak current flows out through the direct current amplifier A1 constituting the first voltage application means M1, or flows in through the direct current amplifier A1. This leak current therefore flows through the output terminal OUT side, but does not flow through the input terminal IN side (note that the current paths are depicted in FIG. 6 based on FIGS. 2A and 2B).

INDUSTRIAL APPLICABILITY

According to the semiconductor switch circuit described in Embodiments 1 through 3 above, a leak current does not flow through either the input terminal IN or the output terminal OUT; therefore, this semiconductor switch circuit can be used as the switches S in the matrix circuit of the semiconductor device testing apparatus described in, e.g., FIG. 7.

The semiconductor switch circuit described in Embodiments 4 and 5 can be used in a device in which a leak current can be allowed to flow through either the input terminal IN side or the output terminal OUT side.

The invention claimed is:

1. A semiconductor switch circuit comprising:
a first semiconductor switch, a second semiconductor switch, and a third semiconductor switch inserted between an input terminal and an output terminal and connected in series;
first and second voltage application means connected in parallel to the first semiconductor switch, one end of which is connected to said input terminal and the other end is connected to one end of the second semiconductor switch, and to the third semiconductor switch, one end of which is connected to the other end of the second semiconductor switch and the other end is connected to said output terminal; and
switch control means for operating and controlling said first semiconductor switch, second semiconductor switch, and third semiconductor switch in the ON and OFF states, and simultaneously operating and controlling the first and second voltage application means in the OFF and ON states in a reverse mode;
wherein when said first semiconductor switch, second semiconductor switch, and third semiconductor switch are operated and controlled in the OFF state by the switch control means, said first and second voltage application means are each controlled to the ON state, the first voltage application means applies the potential of the input terminal to a first voltage application point that is the junction between said first semiconductor switch and second semiconductor switch, and the second voltage application means applies the potential of the output terminal to a second voltage application point that is the junction between said second semiconductor switch and third semiconductor switch.

2. A semiconductor switch circuit comprising:
at least two semiconductor switches inserted between an input terminal and an output terminal and connected to each other in series;
voltage application means connected in parallel to either one of said two semiconductor switches; and
switch control means for operating and controlling said two semiconductor switches in the ON state and OFF state, and simultaneously controlling said voltage application means in the OFF state and ON state in a reverse mode;
wherein when said two semiconductor switches are operated and controlled in the OFF state by the switch control means, said voltage application means is controlled to the ON state, and applies to a voltage application point that is the junction of said two semiconductor switches the potential of the input terminal or output terminal to which said one of the semiconductor switches that is connected in parallel to the voltage application means is connected.

3. The semiconductor switch circuit according to claim 1 or 2, wherein said voltage application means comprises:
a direct current amplifier set to a gain state of approximately +1; and
a voltage application semiconductor switch connected between the output terminal of the direct current amplifier and the voltage application point, for operating in a reverse mode with said semiconductor switches.

4. The semiconductor switch circuit according to claim 1 or 2, wherein said voltage application means comprises:

a direct current amplifier set to a gain state of approximately +1; and a resistor connected between the output terminal of the direct current amplifier and the voltage application point.

5. The semiconductor switch circuit according to claim 1 or 2, wherein said semiconductor switch that is connected in parallel to the voltage application means comprises anti-parallel connected diode elements.

6. A matrix circuit comprising:
a plurality of input terminals;
a plurality of output terminals; and
a plurality of semiconductor switches arranged in matrix form between the input terminals on one side and the output terminals on the other side of a matrix circuit; wherein the semiconductor switch circuit according to claim 1 or 2 is used as said semiconductor switches arranged in matrix form in the matrix circuit.

7. A semiconductor device testing apparatus including a matrix circuit in which the semiconductor switch circuit according to claim 1 or 2 is used, whereby a plurality of voltage/current generators are connected to a plurality of terminal pins of a semiconductor device under test by means of said matrix circuit.

8. A matrix circuit comprising:
a plurality of input terminals;
a plurality of output tenninals; and
a plurality of semiconductor switches arranged in matrix form between the input terminals on one side and the output terminals on the other side of a matrix circuit; wherein the semiconductor switch circuit according to claim 3 is used as said semiconductor switches arranged in matrix form in the matrix circuit.

9. A matrix circuit comprising:
a plurality of input terminals;
a plurality of output terminals; and
a plurality of semiconductor switches arranged in matrix form between the input terminals on one side and the output terminals on the other side of a matrix circuit; wherein the semiconductor switch circuit according to claim 4 is used as said semiconductor switches arranged in matrix form in the matrix circuit.

10. A matrix circuit comprising:
a plurality of input terminals;
a plurality of output terminals; and
a plurality of semiconductor switches arranged in matrix form between the input terminals on one side and the output terminals on the other side of a matrix circuit; wherein the semiconductor switch circuit according to claim 5 is used as said semiconductor switches arranged in matrix form in the matrix circuit.

11. A semiconductor device testing apparatus including a matrix circuit in which the semiconductor switch circuit according to claim 3 is used, whereby a plurality of voltage/current generators are connected to a plurality of terminal pins of a semiconductor device under test by means of said matrix circuit.

12. A semiconductor device testing apparatus including a matrix circuit in which the semiconductor switch circuit according to claim 4 is used, whereby a plurality of voltage/current generators are connected to a plurality of terminal pins of a semiconductor device under test by means of said matrix circuit.

13. A semiconductor device testing apparatus including a matrix circuit in which the semiconductor switch circuit according to claim 5 is used, whereby a plurality of voltage/current generators are connected to a plurality of terminal pins of a semiconductor device under test by means of said matrix circuit.

* * * * *